United States Patent [19]
Hopwood

[11] Patent Number: 5,942,855
[45] Date of Patent: Aug. 24, 1999

[54] MONOLITHIC MINIATURIZED INDUCTIVELY COUPLED PLASMA SOURCE

[75] Inventor: Jeffrey A. Hopwood, Needham, Mass.

[73] Assignee: Northeastern University, Boston, Mass.

[21] Appl. No.: 08/703,975

[22] Filed: Aug. 28, 1996

[51] Int. Cl.⁶ ................................................ H05H 1/46
[52] U.S. Cl. ................................. 315/111.51; 118/723 I
[58] Field of Search .................... 315/111.51; 118/723 I, 118/723 IR, 723 AN; 156/345 C

[56] References Cited

U.S. PATENT DOCUMENTS

| | | | |
|---|---|---|---|
| 3,616,461 | 10/1971 | Gorin | 118/723 I X |
| 4,948,458 | 8/1990 | Ogle | 156/643 |
| 5,277,751 | 1/1994 | Ogle | 156/345 C |
| 5,280,154 | 1/1994 | Cuomo et al. | 219/121.52 |
| 5,433,812 | 7/1995 | Cuomo et al. | 156/345 |
| 5,464,476 | 11/1995 | Gibb et al. | 118/73 I X |
| 5,558,722 | 9/1996 | Okumura et al. | 118/723 I |
| 5,565,738 | 10/1996 | Samukawa et al. | 315/111.51 |
| 5,587,038 | 12/1996 | Cecchi et al. | 118/723 I X |
| 5,650,032 | 7/1997 | Keller et al. | 118/723 I X |
| 5,685,941 | 11/1997 | Forster et al. | 118/723 I X |

FOREIGN PATENT DOCUMENTS

| | | |
|---|---|---|
| 0379828 | 1/1990 | European Pat. Off. . |
| 2231197 | 7/1990 | United Kingdom . |

*Primary Examiner*—Benny T. Lee
*Attorney, Agent, or Firm*—Weingarten, Schurgin, Gagnebin & Hayes LLP

[57] ABSTRACT

A monolithic inductively coupled plasma generator includes a first substrate having an electrical circuit disposed thereon which includes a substantially planar inductive coil, a capacitor electrically coupled in series with the coil, and a drive circuit electrically coupled to the coil for driving the circuit at resonance. The plasma generator further includes a plasma chamber proximate the coil in which a gas is excited. In accordance with the invention, a method of fabricating an inductively coupled plasma generator includes the steps of providing a first substrate, depositing at least one layer of conductive material on the first substrate, patterning and etching the at least one layer of conductive material to form an electrical circuit including a coil and a capacitor, providing a plasma chamber proximate the electrical circuit, providing a gas to the plasma chamber, and connecting an oscillator to the electrical circuit for providing radio frequency energy to the electrical circuit wherein the gas is excited into a plasma.

12 Claims, 3 Drawing Sheets

MONOLITHIC MINIATURIZED INDUCTIVELY COUPLED PLASMA SOURCE

FIELD OF THE INVENTION

The present invention relates generally to plasma generation, and more particularly to an inductively coupled plasma generator.

BACKGROUND OF THE INVENTION

Plasma generation is useful for a variety of applications. For example, complex gas analyzers may excite a gas to cause the gas to emit energy at characteristic frequencies which may be analyzed. Also, in semiconductor fabrication, plasma may be used for etching, resist removal, passivation and deposition. Other applications include miniature chemical sensors, miniature ion beams, and information displays derived from addressable arrays of miniature plasmas.

Large scale, planar inductively coupled plasmas have a high degree of efficiency, as measured in eV per electron-pair created, as well as low cost and lack of complexity. Also, the electrodeless operation of the inductively coupled plasma generators allow continuous operation in reactive and corrosive environments. However, the size of typical inductively coupled plasmas are 10–100 cm and constructed from discrete components. These dimensions and design parameters limit the types of applications for these devices.

Currently available small-scale plasma technologies have several disadvantages. For example, corona discharges require extremely high electrode voltages that are not compatible with small scale lengths due to electrical breakdown. Also, the electrodes are subject to contamination and erosion due to the high energy plasma. In another example, capacitive alternating current discharges, which are used in inert gas plasma displays, include electrodes coated with a thin film which exhibits a high secondary electron yield, thereby allowing plasma generation at relatively low voltages. However, the film is contaminated and ineffective in a reactive gas environment. Also, plasma generation efficiency is low in these devices. An additional disadvantage of conventional small-scale plasma technologies is the significant fabrication cost associated therewith.

One example of plasma generation is found in U.S. Pat. No. 5,280,154 to Cuomo et al. disclosing a plasma processing apparatus having many discrete components that applies radio frequency energy to a nine inch square, 0.75 inch thick coil wherein a wafer is positioned 6–15 cm from the coil. In U.S. Pat. No. 4,948,548 to Ogle, a method and apparatus is described for producing uniform plasmas over a wide area by inducing a current in a coil to produce a magnetic field within an enclosure having a wafer therein. Ogle discloses coils having diameters from 8 to 20 cm.

It would be desirable to provide a microelectrical mechanical system (MEMS) plasma generator that is compatible with integrated electronics, operates at relatively low temperatures and voltages, is efficient, has a broad gas pressure range, has scale lengths in the order of millimeters, is inexpensive to manufacture, and is of planar geometry.

SUMMARY OF THE INVENTION

The present invention provides an inductively coupled plasma generator that is efficient, miniature, and compatible with integrated electronics, thus overcoming the aforesaid and other disadvantages. In a first embodiment, the plasma generator includes a first substrate having an electrical circuit disposed thereon which includes a substantially planar inductive coil and a capacitor electrically coupled in series with the coil, a drive circuit electrically coupled to the coil for driving the circuit, and a plasma chamber proximate the coil in which a gas is excited.

In accordance with the invention, a method of fabricating an inductively coupled plasma generator includes the steps of providing a first substrate, depositing at least one layer of conductive material on the first substrate, patterning and etching the at least one layer of conductive material to form an electrical circuit including a coil and a capacitor, providing a plasma chamber proximate the electrical circuit, providing a gas to the plasma chamber, and connecting an oscillator to the electrical circuit for generating radio frequency energy to the electrical circuit wherein the gas is excited into a plasma.

BRIEF DESCRIPTION OF THE DRAWINGS

Other features and advantages of the invention will be apparent from the following detailed description of the invention in conjunction with the accompanying drawings, in which.

DETAILED DESCRIPTION OF THE INVENTION

Figure 1A:
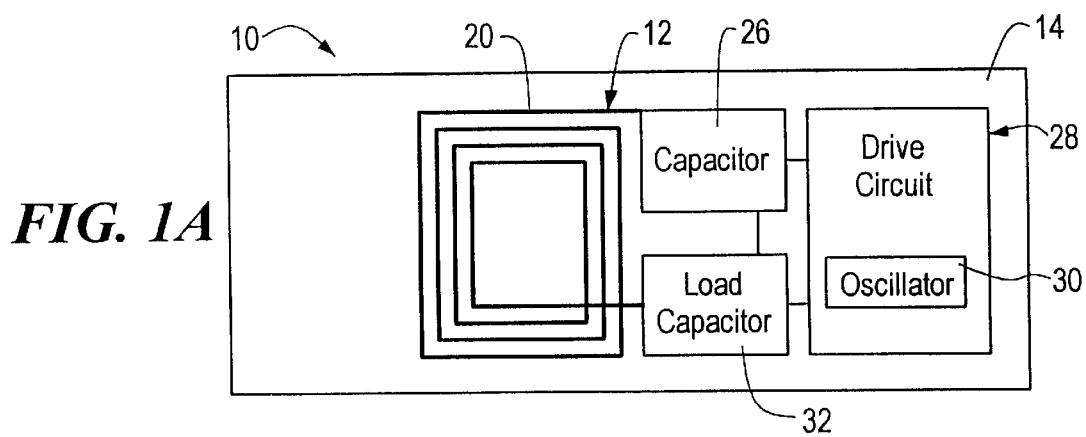
FIG. 1A is a top view of an inductively coupled plasma generator according to the present invention.
Figure 1B:
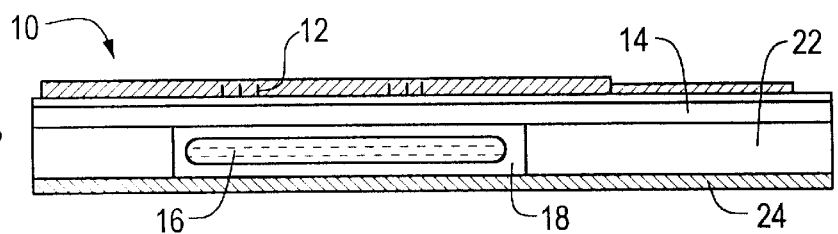
FIG. 1B is a cross-sectional view of the plasma generator of FIG. 1A.

FIGS. 1A and 1B illustrate a miniaturized plasma generator 10 including an electrical circuit 12 disposed on a first substrate 14 for exciting a gas into a plasma 16 (see FIG. 1B) within a plasma chamber 18 (See FIG. 1B). The electrical circuit 12 includes a planar coil 20 (See FIG. 1A) for inductively exciting a portion of the gas into a plasma 16.

In an exemplary embodiment, as shown in FIG. 1B, a second substrate 22 includes the plasma chamber 18 and is bonded to the first substrate 14. A third substrate 24 is bonded to the second substrate 22 wherein the second substrate is between the first substrate and the third substrate. It will be appreciated however, that the plasma generator 10 can alternatively be formed from a single substrate or from other configurations of substrate layers.

The electrical circuit 12 includes the coil 20, a capacitor 26, and drive circuit 28 including an oscillator 30, as seen in FIG. 1A. In an exemplary embodiment, the electrical circuit includes load capacitor 32 (See FIG. 1A) having a capacitance $C_{load}$ for cancelling the inductive reactance of the coil and capacitor, thus presenting a real impedance to the oscillator 30. The coil 20 has an inductance $L_{coil}$, and the capacitor 26 has a capacitance $C_{tune}$. In an exemplary embodiment, the electrical circuit 12 is formed on the substrate using deposition and etching techniques. However, other embodiments include the use of components, such as fixed film capacitors and capacitors having a capacitance controlled by a voltage, connected to the substrate.

The oscillator 30 is formed from a conventional integrated circuit including an astable multivibrator and a power amplifier using MOSFET or bipolar transistors. The oscillator 30 is bonded to the first substrate 14. Alternatively, the oscillator may be integrally formed on the first substrate 14, or may be located away from the substrate. The oscillator 30 provides a signal typically having a frequency in the range from 1 MHz to 1 GHz, although lower and higher frequency signals may be generated. The oscillator 30 is powered by an external power source (not shown) providing power in the order of up to several Watts, for example from 0.1 to 10 Watts, depending upon the power requirements of the plasma generator. The power source may be a battery which can be disposed on the plasma generator or external thereto.

The drive circuit 28 can contain a photoresistive element for detecting light generated by the plasma coupled to a control circuit for optimizing the light intensity of the plasma by adjusting the frequency of the oscillator 30. Thus, the control circuit automatically adjusts the frequency of the oscillator based on the light emitted by the plasma and detected by the photoresistive element.

Figure 2:
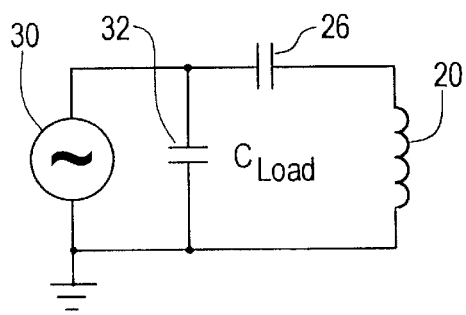
FIG. 2 is a schematic diagram of an electrical circuit forming a part of the plasma generator of FIG. 1A.

As shown schematically in FIG. 2, the capacitor 26 is coupled in series with the coil 20 which are coupled in parallel with the oscillator 30. In an exemplary embodiment, the circuit further includes a load capacitor 32 having a capacitance $C_{load}$ coupled in parallel with the series coupled capacitor 26 and coil 20, the load capacitor cancelling the inductive reactance of the coil and the capacitor, thus presenting a real impedance to the oscillator 30.

In an exemplary embodiment, the width of the coil 20 is about 0.4 cm and has four turns. The circuit 12 resonates at a frequency $f$ defined by equation (1).

$$f \approx (1/2\pi)(L_{coil}C_{tune})^{-1/2} \qquad (1)$$

For $L_{coil}$=63 nH, and $C_{tune}$=10 pF, the resonant frequency is about 200 MHz. The oscillator 30 drives current through the coil 20 forming an electromagnetic field which excites a portion of the gas into a plasma 16 within the plasma chamber 18. At a frequency of about 200 MHz, the current in the coil 20 is about 2.3 Amps, the coil voltage is about 183 Volts, the electron temperature is about 2 eV, and the electron density is about $5 \times 10^{11}$ cm$^{-3}$. The gas is Argon at a pressure of about 1 Torr in an exemplary embodiment, but other gases such as air, oxygen, nitrogen, engine exhaust, industrial emissions, atmospheric gases, and other gases may be used at different pressures. The oscillator 30 provides radio frequency power in the range from 0.1 to 10.0 Watts at frequencies from 10 MHz to 1 GHz. The circuit 12 is tuned by adjusting the frequency of the oscillator 30, allowing the capacitor 26 to be of fixed capacitance. As will be appreciated by one skilled in the art, the capacitors may have a capacitance adjustable by an applied voltage as known to one skilled in the art. The plasma generator 10 has no moving parts and the electrical circuit 12 is tuned by varying the frequency applied by the oscillator 30.

Figure 3:
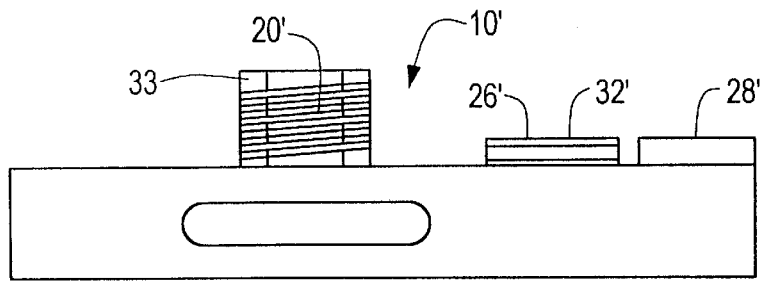
FIG. 3 is a cross-sectional view of an alternative embodiment of the plasma generator of FIG. 1A.

In another embodiment shown in FIG. 3, a plasma generator 10' includes a coil 20' having twenty turns formed from 0.5 mm diameter copper wire wound on a pyrex tube 33 having an outer diameter of about 6 mm and an inner diameter of about 4 mm. The coil 20' has an inductance of about 1.5 microHenries. The resonant frequency of the circuit 12' is about 13.56 MHz after adjusting $C_{tune}$ to about 92 pF, where $C_{load}$ is about 1000 pF. This embodiment also includes coil 20', series coupled capacitor 26', drive circuit 28', and load capacitor 32' as in the embodiment of FIG. 2. Other embodiments are contemplated including a coil having any number of turns and various sizes, such as from 1 mm to 2 cm, are possible and within the spirit and scope of the invention.

Figure 4:
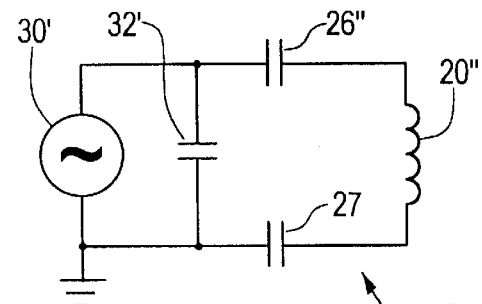
FIG. 4 illustrates an alternative embodiment of the electrical circuit of FIG. 2.

FIG. 4 shows an alternative embodiment of an electrical circuit 12' further including a balance capacitor 27 coupled to a coil 20'' in series so that a first end of the coil is coupled to a capacitor 26'' and a second end of the coil is coupled to the balance capacitor. The coil 20'', the capacitor 26'', and the balance capacitor 27 are connected in series across load capacitor 32'. Oscillator 30' is coupled in parallel across the load capacitor 32'. In an exemplary embodiment, both the capacitor 26'' and the balance capacitor 27 have a capacitance equal to two times the capacitance of the capacitor of FIG. 3.

As shown generally in FIGS. 5A–5F, a plasma generator incorporating the circuit of FIG. 2 is formed in a series of exemplary fabrication steps. As corresponding elements in FIGS. 5A–5F have like reference numerals, not all labeled elements will be described in detail in all figures in which they occur. The coil 20, shown having three turns, capacitor 26 and load capacitor 32 are formed from sequential deposition and patterned etching. It will be appreciated that means other than that disclosed herein may be used to form electrical connections and circuits on a substrate. For example, e-beam, screen printing, laser-assisted deposition, selective chemical vapor deposition, and other techniques may be used.

Figure 5A:
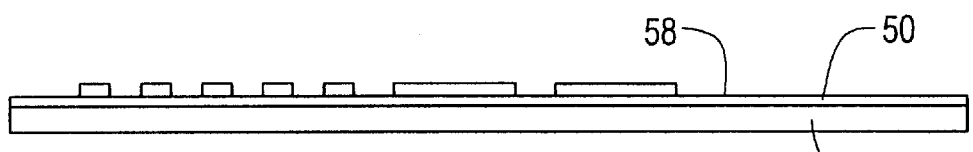
FIG. 5A is a cross sectional view of a plasma generator incorporating the electrical circuit of FIG. 2 at a first stage of fabrication.
Figure 5B:
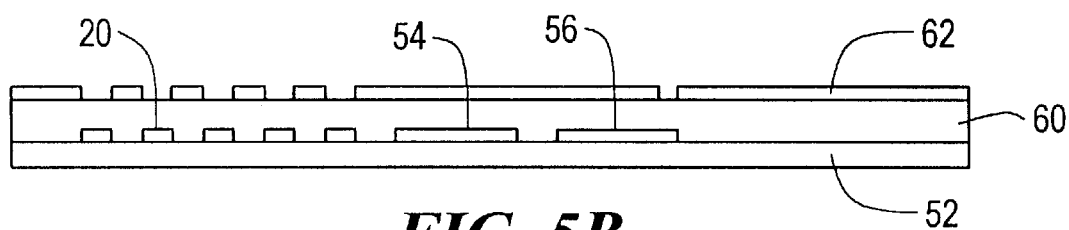
FIG. 5B is a cross sectional view of a plasma generator at a second state of fabrication.
Figure 5C:
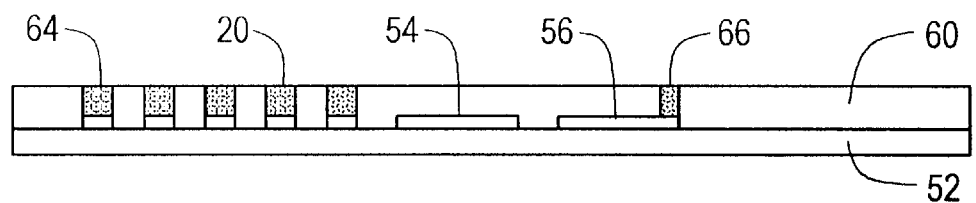
FIG. 5C is a cross sectional view of the plasma generator at a third stage of fabrication.
Figure 5D:
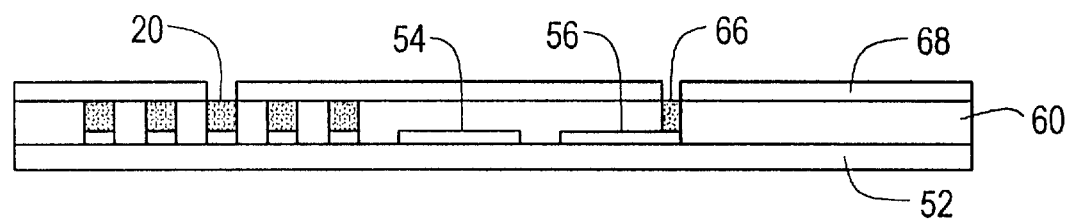
FIG. 5D is a cross sectional view of the plasma generator at a fourth stage of fabrication.

In a first embodiment, shown in FIG. 5A, a layer 50 of combined chromium (Cr) and gold (Au) is deposited on a substrate 52 by vapor deposition. Alternative methods known to one skilled in the art may of course be used to deposit the layer 50 on the substrate 52. The Cr/Au layer 50 forms a seed layer for the coil 20, the capacitor 26, and the load capacitor 32. A first photoresist layer 58 is then applied over the Cr/Au layer 50 and patterned by an ultra violet (UV) light source (not shown). Unexposed photoresist layer material is then etched to expose portions of the Cr/Au layer 50. The exposed portions of the Cr/Au layer 50 are then chemically etched to form a portion of the coil 20, a lower electrode 54 of the capacitor 26, and a lower electrode 56 of the load capacitor 32. Exposed photoresist layer material is then also removed. As shown in FIG. 5B, a first polyimide layer 60 is applied over the substrate 52 and coil 20 and remaining Cr/Au using a spin on process comprising the steps of applying liquid polyimide to layer 50, spinning the substrate 52 at about 1000 rpm for about sixty seconds to evenly spread the polyimide, and curing the polyimide in a nitrogen filled furnace at a temperature ranging from about 300 to 400 degrees Celsius for about one to ten hours. A second photoresist layer 62 is applied over the first polyimide layer 60. The second photoresist layer 62 is then patterned as before using a UV light source and a photo-resist layer to expose portions of the first polyimide layer 60, as shown in FIG. 5C. The exposed portions of the first polyimide layer 60 are then etched using deep plasma etch techniques to expose the Cr/Au material. Alternatively, an additional thin layer of spin-on-glass (SOG) can be applied between the second photoresist layer 62 and the first polyimide layer 60. The additional SOG layer is patterned and etched to form a "hard mask" for the deep plasma etch of the first polyimide layer 60. The "hard mask" is appropriate when the thickness of the first polyimide layer 60 equals or exceeds the maximum practical thickness (about five micrometers) of the second photoresist layer 62.

Figure 5E:
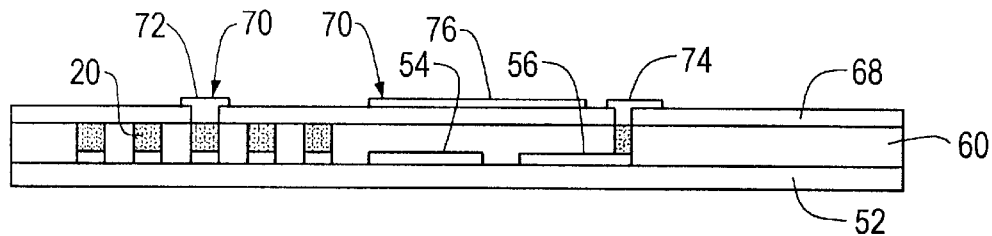
FIG. 5E is a cross sectional view of a plasma generator at a fifth stage of fabrication.

Copper (Cu) electroplate 64 (FIG. 5C) forms a further portion of the coil 20 and a capacitor connection 66 coupled to the lower electrode 56 of the load capacitor 32 where the first polyimide layer 60 has been selectively etched away. The copper electroplate 64 forming the coil 20 and capacitor connections 66 is deposited by immersion of the workpiece in a copper plating solution and applying an electrical potential to the Cr/Au layer 50. It will be appreciated that other methods can be used such as chemical vapor deposition (CVD) and physical vapor deposition for example. A second polyimide layer 68 (FIG. 5D) is then spun over the Cu electroplate 64 and remaining first polyimide layer 60 using the spin on process. The second polyimide layer 68 is then patterned and etched to expose a portion of the coil 20 and the capacitor connection 66. A second Cr/Au layer 70 (FIG. 5E) is deposited on the second polyimide layer 68 and exposed Cu electroplate 64. As seen in FIG. 5E, a third photoresist layer is then applied, patterned and etched to form a coil bonding pad 72 at an end of the coil 20, a capacitor bonding pad 74 which is coupled to the capacitor connection 66, and an upper electrode 76 of the capacitor 26 and load capacitor 32.

Figure 5F:
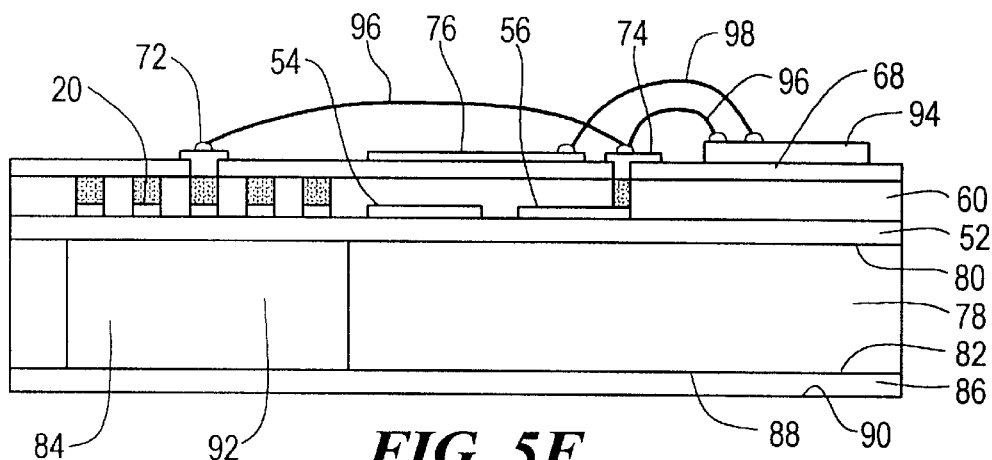
FIG. 5F is a cross-sectional view of the plasma generator as fully fabricated.

As seen in FIG. 5F, a second substrate 78 having a first side 80, a second side 82, and an aperture 84 therethrough, is then bonded to the first substrate 52 at the second substrate first side 80. A third substrate 86 having a first side 88 and a second side 90 is then bonded to the second substrate second side 82 at the first side 88 of the third substrate. The second substrate aperture 84 is closed on either side by the respective first and third substrates 52,86 thereby forming a plasma chamber 92. The plasma chamber 92 outer periphery substantially conforms to the perimeter of the coil 20. In a preferred embodiment, the height of the plasma chamber 92 is about one millimeter, but may range from about 0.1 to 10 mm. It will be appreciated that a plasma generator and plasma chamber may be formed with a single substrate.

An oscillator 94 is then bonded to the second polyimide layer 68. An oscillator external to the plasma generator may of course be used in an alternative embodiment. A first oscillator connection 96 is made from the oscillator 94 to the capacitor bonding pad 74 and coil bonding pad 72, thereby connecting the oscillator 94, load capacitor lower electrode 56 and coil 20. A second oscillator connection 98 is made from the oscillator 94 to the capacitor and load capacitor upper electrode 76. The first and second oscillator connections 96,98 are formed from gold wire. As will be appreciated, other materials or means may be used to make the connections, such as adding additional substrate and conductive layers with associated traces and vias.

Figure 6:
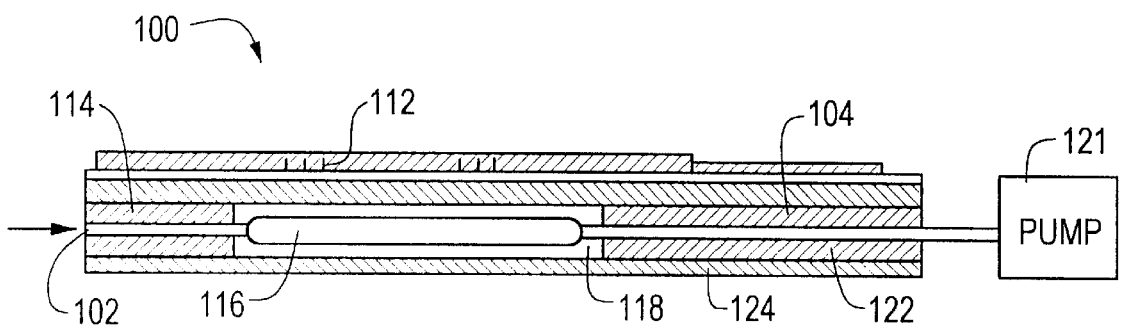
FIG. 6 is an another embodiment of the plasma generator of FIG. 1B according to the present invention.

Referring now to FIG. 6, a plasma generator 100 includes an electrical circuit 112 disposed on a first substrate 114, a plasma chamber 118 disposed within a second substrate 122, and a third substrate 124 affixed to the second substrate. The plasma generator 100 further includes a micromachined input channel 102 in communication with the plasma chamber 118 for allowing a gas to enter the plasma chamber and an output channel 104 for evacuating the plasma chamber wherein a portion of the gas is excited into a plasma 116. In an illustrative embodiment, the input and output channels 102,104 are disposed in the second substrate 122, but are not limited thereto. In an exemplary embodiment, a vacuum pump 121 is coupled to the output channel 104 for evacuating the plasma chamber 118. In an illustrative embodiment, the vacuum pump is a peristaltic pump known to one skilled in the art. It will be appreciated that at least one pump or valve may also be in communication with the input channel. In an alternative embodiment, there is a regulated flow of gas through the plasma chamber in a continuously sampling system.

The plasma generator of the present invention provides a miniaturized plasma source for applications such as gas analysis and chemical sensors, ion implantation, etching, addressable displays, and ion beams for diagnostic purposes or propulsion. The miniaturized size of the plasma generator may be crucial for space limited applications. The fabrication techniques and materials for making the present invention are low cost and thus amenable for disposable applications. The electrodeless design allows operation in corrosive and rugged environments, and may be radiation hardened for space or military applications. The present plasma generator also operates in a broad range of pressures.

Although the invention has been shown and described with respect to exemplary embodiments thereof, various other changes, omissions, and additions in form and detail thereof may be made therein without departing from the actual scope of the invention which is to be limited solely by the spirit and scope of the following claims.

What is claimed is:

1. An inductively coupled plasma generator, comprising:
   a monolithic planar substrate;
   an electrical circuit disposed on said substrate, said circuit including:
     a substantially planar inductive coil; and
     a capacitor electrically coupled in series with said coil;
   a drive circuit electrically coupled to said planar inductive coil for driving said circuit at resonance; and
   a plasma chamber disposed within said substrate; and proximate to said planar inductive coil, said coil for exciting a gas within said plasma chamber.

2. The plasma generator according to claim 1, wherein said electrical circuit further includes a load capacitor coupled in parallel with said series coupled coil and capacitor and a balance capacitor coupled in series to said coil.

3. The plasma generator according to claim 1, wherein said substrate includes a second substrate portion bonded to a first substrate portion, said first substrate portion is continuous and said plasma chamber is disposed within said second substrate portion.

4. The plasma generator according to claim 1 wherein said plasma chamber has a height substantially in the range of 0.1 to 10 mm.

5. The plasma generator according to claim 1 wherein said planar inductive coil having a width about 0.4 cm.

6. A plasma generator, comprising:
   a first monolithic planar insulating substrate;
   an electrical circuit disposed on said first substrate, said circuit comprised of at least one conductive material deposited and etched on said substrate, said circuit including a planar inductive coil and a capacitor;
   an oscillator electrically connected to said electrical circuit for driving said electrical circuit;
   a plasma chamber formed in said substrate substantially aligned with said planar inductive coil driven by said oscillator; and
   a gas confined within said plasma chamber, wherein said gas is inductively excited by said coil.

7. The plasma generator according to claim 6 wherein said planar inductive coil having a width about 0.4 cm.

8. The plasma generator according to claim 6 wherein said plasma chamber has a height substantially in the range of 0.1 to 10 mm.

9. The plasma generator according to claim 6, wherein said electrical circuit further includes a load capacitor coupled to said coil.

10. The plasma generator according to claim 9, wherein said capacitor is coupled in series with said coil, and said load capacitor is coupled in parallel with said series coupled coil and capacitor.

11. The plasma generator according to claim 9, wherein said electrical circuit further includes a balance capacitor coupled to said coil.

12. The plasma generator according to claim 6, wherein said electrical circuit is driven by said oscillator at resonance.

* * * * *